(12) United States Patent
Neffling

(10) Patent No.: US 6,333,676 B1
(45) Date of Patent: Dec. 25, 2001

(54) CONTROL METHOD AND CONTROL ARRANGEMENT

(75) Inventor: Toni Neffling, Espoo (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/529,226

(22) PCT Filed: Oct. 27, 1998

(86) PCT No.: PCT/FI98/00834

§ 371 Date: Apr. 10, 2000

§ 102(e) Date: Apr. 10, 2000

(87) PCT Pub. No.: WO99/25072

PCT Pub. Date: May 20, 1999

(30) Foreign Application Priority Data

Oct. 29, 1997 (FI) ........................................... 974086

(51) Int. Cl.$^7$ ................. H03F 1/00; H03F 1/26
(52) U.S. Cl. ............................. 330/151; 330/149
(58) Field of Search .................... 330/149, 151

(56) References Cited

U.S. PATENT DOCUMENTS

| | | | |
|---|---|---|---|
| 4,580,105 | 4/1986 | Myer | 330/149 |
| 5,157,345 | 10/1992 | Kenington et al. | 330/149 |
| 5,334,946 | * 8/1994 | Kennington et al. | 330/151 |
| 5,742,201 | * 4/1998 | Eisenberg et al. | 330/149 |
| 5,963,091 | * 10/1999 | Chen et al. | 330/151 |

FOREIGN PATENT DOCUMENTS

| | | |
|---|---|---|
| 2 107 540 A | 4/1983 | (GB) . |
| 97/37427 A1 | 10/1997 | (WO) . |

\* cited by examiner

Primary Examiner—Robert Pascal
Assistant Examiner—Patricia Nguyen
(74) Attorney, Agent, or Firm—Pillsbury Winthrop LLP

(57) ABSTRACT

The invention relates to a control method and a control arrangement which comprises a feedforward power amplifier (10), which receives and amplifies a signal and which on amplifying the signal causes non-linearities to the signal. The control arrangement also comprises adjusting members (50, 80) and adaptation means (110, 130), which form an adaptation factor and control the operation of the adjusting means (50, 80) by means of the adaptation factor by adapting the amplitudes and phases of signal propagating along different signal paths to one another. The control arrangement further comprises control means (120), which produce information of the gain required by the power amplifier (10), said control means (120) ordering the adaptation means (110, 130) to adjust the adaptation factor in advance on the basis of the received information to correspond to the gain of the power amplifier (10), which enables adaptation of the signal also when the input power level changes rapidly.

20 Claims, 2 Drawing Sheets

CONTROL METHOD AND CONTROL ARRANGEMENT

FIELD OF THE INVENTION

The invention relates to a control method used in a feedforward power amplifier, which receives a signal and on amplifying the signal causes non-linearities to the signal, the method comprising forming an adaptation factor by means of which the amplitudes and phases of signals propagating along different signal paths are adapted to one another.

BACKGROUND OF THE INVENTION

Broadband amplifiers and power amplifiers, in particular, cause distortion to a signal, since the amplifiers function non-linearly at least to some degree. Besides distortion amplifiers cause for example noise. The influence of distortion caused by amplifiers has been reduced by means of different connections. In feedforward amplifiers distortion has been reduced by separating distortion from a signal after amplification. After separation, distortion has been added as negative distortion to a signal containing distortion, and thus the distortion components have canceled each other out. The resulting amplified signal has contained considerably less distortion than an unamplified signal.

Usually, the incoming end and outgoing end of the amplifier have to be adapted to signal paths. Processing of signals always causes some delay to a signal. For this reason adaptation of the delay and gain requires particular accuracy so that the amplifier would function as desired in all operational environments. Prior art amplifiers have been provided with signal cancellation loops and error cancellation loops, where the phase and amplitude of the influencing signal have been adjusted. Adjustment has enabled reduction of distortion in the signal. The amplifier has been part of a control arrangement which has been able to adapt to the received signal to some degree.

Prior art amplifiers cannot, however, adapt to a signal if the power level of the incoming signal varies a lot, which is the case e.g. in CDMA radio systems. The temperature also causes problems to adaptation. The above-mentioned issues render signal adaptation more difficult since the non-linearities of an amplifier depend greatly on the fluctuation of the power level and on the temperature.

Special factors, which can be denoted with α and β, are employed for adjusting the phase and amplitude. The factors are changed and adjusted by means of an adaptation factor, which is denoted with K. When the power level of an input signal changes rapidly, the adaptation factor also needs to change rapidly to correspond to the changed situation. In prior art solutions adaptation factors have, however, been constant, and thus the adaptation of the input signal has occurred too slowly. Slow adaptation has resulted in inaccurate adjustment.

BRIEF DESCRIPTION OF THE INVENTION

The object of the invention is to provide a control method and control arrangement which allow to solve the above-mentioned problems. This is achieved with a control arrangement described in the introduction, the control arrangement being characterized in that information is produced on the gain required by an amplifier, and on the basis of the information the adaptation factor to be used is changed in advance to correspond to the gain of the amplifier, which enables adaptation of the signal when the input power level changes rapidly.

The object is also achieved with a control arrangement, which comprises a feedforward power amplifier, which receives and amplifies a signal and which on amplifying the signal causes non-linearities to the signal, and adjusting members and adaptation means, which form an adaptation factor and control the operation of the adjusting members by means of the adaptation factor by adapting the amplitudes and phases of signals propagating along different signal paths to one another.

The control arrangement of the invention is characterized in that the control arrangement comprises control means, which produce information on the gain required by a power amplifier, and on the basis of the received information the control means order the adaptation means to adjust the adaptation factor in advance to correspond to the gain of the power amplifier, which enables adaptation of the signal also when the input power level changes rapidly.

The dependent claims relate to preferred embodiments of the invention.

The invention is based on the idea that information on the signal to be amplified is supplied to the control arrangement in advance, which enables adaptation of the control arrangement to the signal to be amplified in advance.

The control method and control arrangement of the invention have several advantages. The control arrangement comprises control means which receive information on power in advance. The control arrangement further comprises adaptation means, which form an adaptation factor on the basis of the power information. The control arrangement allows the signal to be amplified to be adapted to different signal paths when the input power level of a power amplifier changes rapidly. The control arrangement is suitable for power amplifiers of base stations in radio systems where the addition of e.g. one channel changes the average power required by a transmitter relatively much. The above-mentioned radio systems include CDMA and multi-carrier radio systems.

BRIEF DESCRIPTION OF THE DRAWINGS

The invention will be described more closely by means of preferred embodiments with reference to the accompanying drawings, in which.

DETAILED DESCRIPTION OF THE INVENTION

Figure 1:
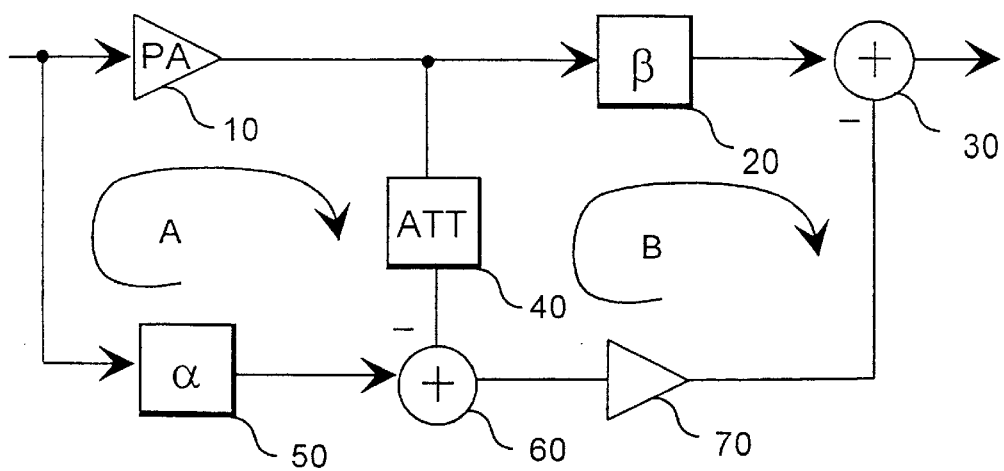
FIG. 1 illustrates a prior art control arrangement.

FIG. 1 illustrates a prior art control arrangement comprising a power amplifier 10, attenuation means 40, amplifier 70 and adders 30, 60. The adders 30, 60 of the control arrangement illustrated in the figure function as subtracters. The control arrangement also comprises adjusting means 20, 50. The adjusting means 50 form factor α. The adjusting means 20 form factor β. The outgoing end of the power amplifier 10 is usually in contact with the adjusting means 20 and attenuation means 40. The incoming end of the power amplifier 10 is in contact with the adjusting means 50. The incoming end of the amplifier 70 is in contact with the adder 60. The outgoing end of the amplifier 70 and the outgoing end of the adjusting means 20 are in contact with the adder 30.

The power amplifier 10, attenuation means 40 and adjusting means 50 form signal cancellation loop A. The adjusting means 20, amplifier 70 and attenuation means 40 form error cancellation loop B. The control arrangement illustrated in the figure is of the feedforward type. In a feedforward amplifier the signal is not fed back to the incoming end of the power amplifier after amplification.

A signal entering the control arrangement and containing information is first supplied to the incoming end of the power amplifier 10. In practice, the power amplifier amplifies the signal amplitude. A signal entering the incoming end of the power amplifier is also supplied to the adjusting means 50. During amplification the power amplifier causes for example distortion to the signal. The distorted signal is supplied to the attenuation means 40, which attenuate the signal. The distorted signal is also supplied to the adjusting means 20, which adapt the received signal by factor β. Thereafter the signal adapted by the adjusting means 20 is supplied to the adder 30.

The adjusting means 50 adapt the received signal by factor a. After adaptation the signal is supplied to the adder 60, which subtracts the attenuated signal from the adapted signal. On the basis of the subtraction a distorted signal can be separated from an information signal entering the control arrangement. The distorted signal is supplied to the amplifier 70, which amplifies the distorted signal. The amplified distorted signal is supplied further to the adder 30, which subtracts the distorted signal from the signal adapted by the adjusting means 20. After the signal is subtracted, we obtain an amplified signal which corresponds to the original information signal and contains no distortion. In practice, the prior art control arrangement cannot, however, adapt to rapid changes of the input signal. For the above-mentioned reason the prior art control arrangement is not very suitable for CDMA radio systems, for example.

Figure 2:
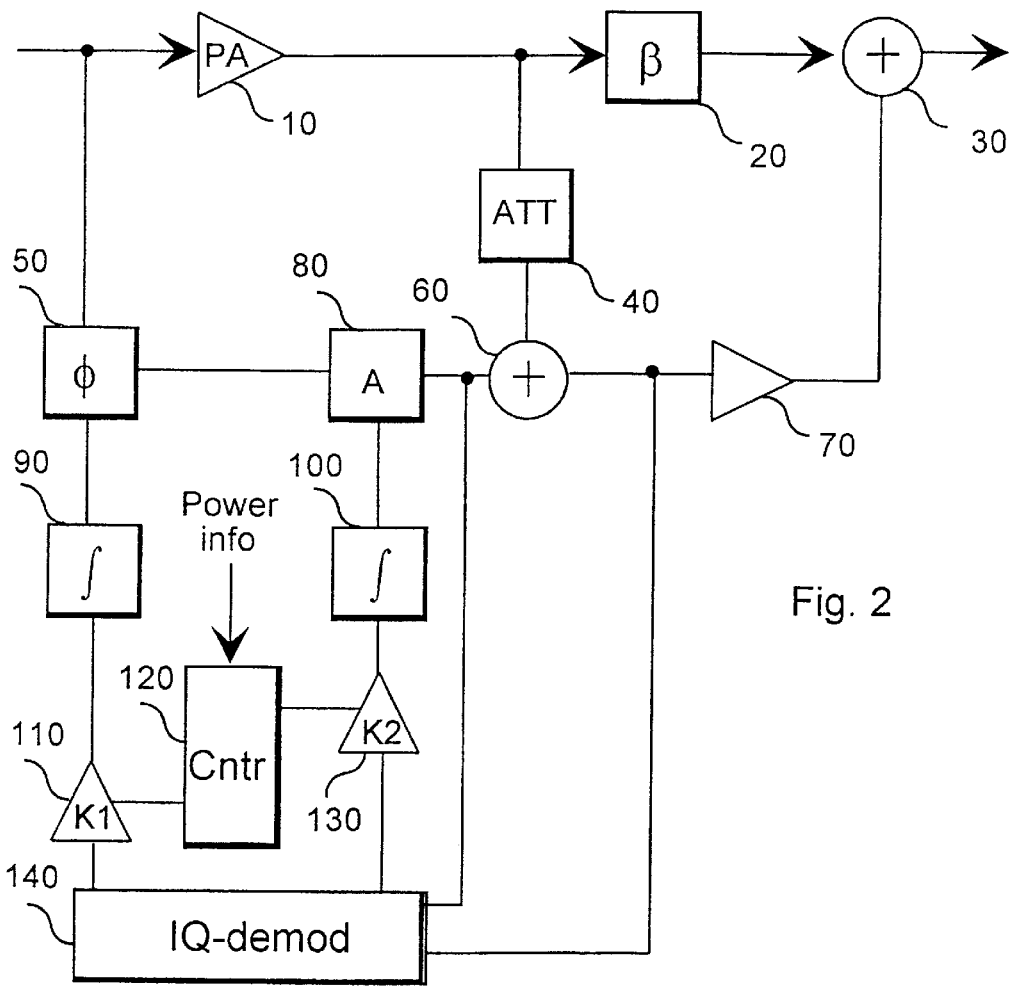
FIG. 2 illustrates a control arrangement of the invention.

FIG. 2 illustrates a control arrangement of the invention. The control arrangement comprises a power amplifier 10, adjusting means 20, adders 30 and 60, attenuation means 40 and amplifier 70. In the solution of the figure the adders 30, 60 function as subtracters. The control arrangement also comprises adjusting means 50, which receive the same signal as the power amplifier 10. The control arrangement further comprises adjusting means 80, which are in contact with the adjusting means 50 and receive a signal from the adjusting means 50. Furthermore, the control arrangement comprises integration means 90, 100. The integration means 90 are in contact with the adjusting means 50. The integration means 100 are in contact with the adjusting means 80.

The control arrangement also comprises adaptation means 110, 130, modulation means 140 and control means 120. The adaptation means 110, 130 form adaptation factors, which are used for controlling the operation of the adjusting means 50, 80. The modulation means 140 receive a signal between the output of the adjusting means 80 and the input of the adder 60. In addition, the modulation means 140 receive a signal between the output of the adder 60 and the input of the amplifier 70. The modulation means 140 demodulate the received signal using the IQ method for separating the signal components from one another.

In the solution of the figure the adaptation means form adaptation factor K1, and the adaptation means 110 form adaptation factor K2. The control means 120 control the operation of the adaptation means 110, 130 on the basis of the information they receive on the power level of the signals. The adjusting means 50 adapt the phase of the received signal to the control arrangement on the basis of the control received via the integration means 90. After the phase of the signal has been changed, the signal is supplied to the adjusting means 80, which change and adapt the amplitude of the received signal so as to render it suitable. The modulation means 140 are in contact with the adaptation means 110, 130, which also utilize the control received from the modulation means 140 when they form an adaptation factor.

The control means 120 receive the information on the gain required by the amplifier 10. The control means 120 send the information further to the adaptation means 110, 130. On the basis of the received information the adaptation means 110, 130 change the adaptation factor in advance so that it corresponds to the gain of the amplifier. The adaptation means 110 send the adaptation factor they have formed further to the adjusting means 50 via the integration means 90. The adaptation means 130 send the adaptation factor they have formed further to the adjusting means 80 via the integration means 100. Since the adaptation factor is formed in advance, adaptation can be performed rapidly when the input power level of the amplifier 10 changes.

The adaptation means 110, 130 change the amplitude of the adaptation factor they have formed as the input power of the amplifier changes. The adaptation means 1 10, 130 increase the value of the adaptation factor they have formed in advance as the input power of the amplifier 10 increases. The adaptation means 110, 130 change the complex parameters of the adjusting means 50, 80 using the adaptation factor. The adaptation factor is used for controlling the operation of the adjusting means 50, 80 by adapting the amplitudes and phases of signals propagating along different signal paths to one another.

The adaptation means 110, 130 form factor $\alpha_{n+1}$ for the input signal following the input signal of the amplifier according to the following formula (1):

$$\alpha_{n+1} = \alpha_n - K\nabla \qquad (1)$$

where $\alpha_n$ is the factor used in adapting a signal,
$\alpha_{n+1}$ is the factor used in adapting the signal following the above-mentioned signal,
K is the adaptation factor,
$\nabla$ is the gradient.

Figure 3:
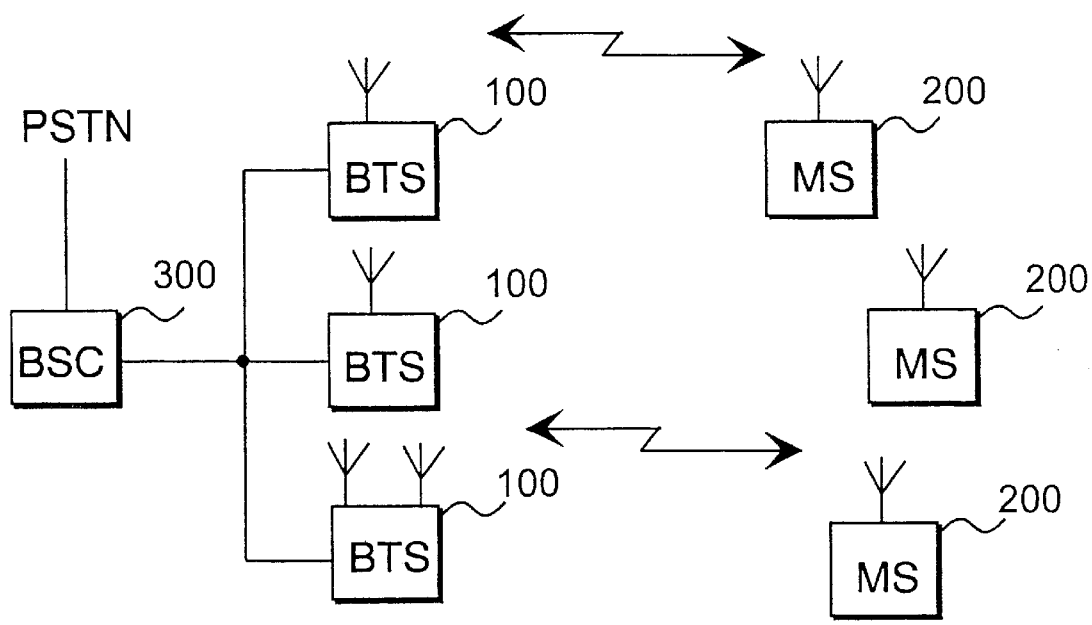
FIG. 3 illustrates a radio system where the control method and control arrangement of the invention are used.

FIG. 3 illustrates a radio system which comprises a base station 100, subscriber terminals 200 and base station controller 300. The radio system of the figure is preferably a CDMA system or a multi-carrier system. In practice, both the base stations and subscriber terminals function as transceivers. The base station controller 300 is in contact with the base stations 100 and controls their operation. The control arrangement illustrated in FIG. 2 is actually located in the base station 100.

In practice, the base station 100 or the base station controller 300 keeps a record of new subscriber terminals 200 which enter the coverage area of the base station and which the base station 100 has to switch on. The base station sends information on the subscriber terminals 200 that are to be switched on to the control means 120 of the control arrangement. The adaptation means 1107 130 change the value of the adaptation factor they have formed in advance so that it corresponds to the power level of the input signal of the amplifier 10.

By means of the control arrangement the base station can adapt to the constant changes of the radio system in advance, and thus the number of transients, for example, can be reduced. The value of the adaptation factor can be increased momentarily, for example, whereby adaptation to the correct power level occurs as fast as possible. When optimal adaptation is achieved, the adaptation factor is decreased and thus the noise cannot increase too much.

Even though the invention is described above with reference to an embodiment illustrated in the accompanying drawings, it is obvious that the invention is not restricted thereto but may be modified in several ways within the scope of the inventive idea disclosed in the appended claims.

What is claimed is:

1. A control method used in a feedforward power amplifier, which receives a signal and which on amplifying the signal causes non-linearities to the signal, the method comprising forming an adaptation factor by means of which the amplitudes and phases of signals propagating along different signal paths are adapted to one another, wherein information is produced on the gain required by the amplifier, and on the basis of the information the adaptation factor to be used is changed to correspond to the gain of the amplifier in advance, which enables adaptation of the signal when the input power level changes rapidly.

2. A method according to claim 1, wherein the adaptation factor is used for correcting the amplitude error and phase error of an unamplified signal.

3. A method according to claim 1, wherein the amplified signal is attenuated, and the amplitude error and phase error of the unamplified signal is corrected, which is followed by calculation of the difference between the attenuated signal and the corrected signal.

4. A method according to claim 1, wherein the value of the adaptation factor is adjusted as the input power of the amplifier changes.

5. A method according to claim 1, wherein the value of the adaptation factor is increased in order to speed up signal adaptation.

6. A method according to claim 1, wherein the value of the adaptation factor is decreased after the optimal adaptation is achieved.

7. A method according to claim 1, wherein the adaptation factor is used for changing complex parameters of the adaptation member.

8. A method according to claim 1, wherein the method is used in a radio system and the information on the gain required by the amplifier is received from the radio system in advance.

9. A method according to claim 1, wherein the method is used for example in power amplifiers of the base stations in CDMA radio systems.

10. A control arrangement which comprises a feedforward power amplifier, which receives and amplifies a signal and which on amplifying the signal causes non-linearities to the signal, and first and second adjusting members and first and second adaptation means, which form an adaptation factor and control the operation of the first and second adjusting members by means of the adaptation factor by adapting the amplitudes and phases of signals propagating along different signal paths to one another, wherein the control arrangement comprises control means, which produce information on the gain required by the power amplifier, said control means ordering the first and second adaptation means to adjust the adaptation factor in advance on the basis of the received information to correspond to the gain of the power amplifier, which enables adaptation of the signal also when the input power level changes rapidly.

11. A control arrangement according to claim 10, wherein the first and second adaptation means correct the input signal of the first and second adjusting members using the adaptation factor.

12. A control arrangement according to claim 10, wherein the adjusting member corrects the phase error of an unamplified signal using the adaptation factor.

13. A control arrangement according to claim 10, wherein the adjusting member corrects the amplitude error of an unamplified signal using the adaptation factor.

14. A control arrangement according to claim 10, wherein the first and second adaptation means adjust the value of the adaptation factor they have calculated as the power of the signal entering the amplifier changes.

15. A control arrangement according to claim 10, wherein the first and second adaptation means increase the value of the adaptation factor they have calculated in advance as the input power of the amplifier increases.

16. A control arrangement according to claim 10, wherein the first and second adaptation means decrease the value of the adaptation factor when the optimal adaptation is achieved.

17. A control arrangement according to claim 10, wherein the first and second adaptation means change complex parameters of the first and second adjusting members using the adaptation factor.

18. A control arrangement according to claim 10, wherein the control arrangement comprises attenuation means, which attenuate the amplified signal, and adders, which calculate the difference between the signal that has propagated through the first and second adjusting members and the attenuated signal.

19. A control arrangement according to claim 10, wherein the control arrangement is used in a radio system, which comprises at least one base station and that the control means of the control arrangement receive the information on the gain required by the amplifier in advance for example from the base station.

20. A control arrangement according to claim 10, wherein the control arrangement is preferably used in power amplifiers of base stations in CDMA radio systems.

* * * * *